(12) United States Patent
Park

(10) Patent No.: US 7,193,243 B2
(45) Date of Patent: Mar. 20, 2007

(54) LED SURFACE LIGHT SOURCE AND PROJECTION SYSTEM USING THE SAME

(75) Inventor: Chan Young Park, Seoul (KR)

(73) Assignee: LG Electronics Inc., Seoul (KR)

( * ) Notice: Subject to any disclaimer, the term of this patent is extended or adjusted under 35 U.S.C. 154(b) by 118 days.

(21) Appl. No.: 10/966,189

(22) Filed: Oct. 15, 2004

(65) Prior Publication Data

US 2005/0083689 A1 Apr. 21, 2005

(30) Foreign Application Priority Data

Oct. 16, 2003 (KR) ........................ 10-2003-0072236

(51) Int. Cl.
*H01L 33/00* (2006.01)
(52) U.S. Cl. .................. 257/80; 362/227; 362/240; 362/241
(58) Field of Classification Search ................ 362/237, 362/227, 231, 240, 241, 800; 257/80, 81, 257/88, 89, 95, 98, 103
See application file for complete search history.

(56) References Cited

U.S. PATENT DOCUMENTS

| 6,680,568 | B2 * | 1/2004 | Fujiwara et al. ............. 313/501 |
| 6,949,772 | B2 * | 9/2005 | Shimizu et al. ................ 257/99 |
| 2004/0207823 | A1 * | 10/2004 | Alasaarela et al. ......... 353/122 |
| 2005/0087748 | A1 * | 4/2005 | Ohno ........................... 257/88 |

FOREIGN PATENT DOCUMENTS

| JP | 408236576 | * | 2/1995 |
| JP | 2003-124528 | | 4/2003 |

* cited by examiner

*Primary Examiner*—Sandra O'Shea
*Assistant Examiner*—Mark Tsidulko
(74) *Attorney, Agent, or Firm*—Lee, Hong, Degerman, Kang & Schmadeka

(57) ABSTRACT

An LED surface light source is provided. The LED surface light source includes: an upper plate having a light emitting part for emitting an LED light and a reflector; a plurality of LEDs regularly arranged in horizontal and vertical directions; and a lower plate on which the plurality of LED are arranged and supported.

20 Claims, 7 Drawing Sheets

(a)

(b)

(a)

(b)

(c)

(a)

(b)

LED SURFACE LIGHT SOURCE AND PROJECTION SYSTEM USING THE SAME

This application claims the benefit of the Korean Application No. 10-2003-0072236 filed on Oct. 16, 2003, which is hereby incorporated by reference.

BACKGROUND OF THE INVENTION

1. Field of the Invention

The present invention relates to a light source, and more particularly, to an LED surface light source capable of obtaining high power output and uniform light.

2. Discussion of the Related Art

Light emitting device (LED) is a device that emits light using an electrical signal. The LED is driven at low power and widely used in small-sized optical parts.

FIG. 1 is a view of an LED according to the related art.

Referring to FIG. 1, an LED includes an LED n-type layer 12, a light emitting layer 13 and an LED p-type layer 14, which are sequentially formed on a substrate 11.

The LED p-type layer 14 is in contact with an anode 15 and coupled to a positive (+) power supply voltage. The substrate 11 is in contact with a cathode 16 and coupled to a negative (−) power supply voltage.

In such an LED, if electrons move due to a voltage difference occurring when a voltage is applied to the anode 15 and the cathode 16, energy change occurs within material of the light emitting layer 13. In this manner, the light is emitted.

Here, the light from the light emitting layer 13 is radiated in omni-direction. Therefore, a reflector 17 is disposed around the LED so as to focus the light in one desired direction.

The light reflected in a predetermined direction by the reflector is focused and outputted by a condenser lens 18.

When the LED is used as a light source, the LED may be used in a type of one module or the integrated LEDs may be used.

FIGS. 2A and 2B are a perspective view and a top view of the conventional LED used as the surface light source, respectively.

As shown, a plurality of LED modules 21 for the surface light source are arranged in horizontal and vertical directions.

However, in the case of the conventional LED surface light source, size of the LED module 21 is so large that a small number of the LEDs are condensed in unit area. As a result, it is difficult to obtain the high power output.

Also, since the gap 22 between the LED arrangements is wide, the light distribution is ununiform and the interconnection of the LEDs is complex.

Accordingly, the conventional LED surface light source has a drawback in that it is difficult to use it as the light source of the projection system requiring the small scale.

SUMMARY OF THE INVENTION

Accordingly, the present invention is directed to a projection system that substantially obviates one or more problems due to limitations and disadvantages of the related art.

An object of the present invention is to provide a small-sized and high-power LED surface light source in which structures of an LED and a reflector are improved so that the LED can be applied as a surface light source.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an LED surface light source including: an upper plate including a light emitting part for emitting an LED light and a reflector; a plurality of LEDs regularly arranged in horizontal and vertical directions; and a lower plate on which the plurality of LED are arranged and supported.

Each of the LEDs may include: an LED chip, an LED base for supporting the LED chip, and a reflector for reflecting light emitted from the LED chip at a specific angle.

The LED chip may include an LED p-type layer, a light emitting layer, an LED n-type layer and a transparent electrode, which are stacked on an LED substrate in sequence.

The LED substrate may be formed of a transparent material, such that light transmits the LED substrate.

A height of a portion where the LED p-type layer contacts with the transparent electrode may be equal to that of a portion where the LED n-type layer contacts with the transparent electrode.

The specific angle of the reflected light may be varied depending on shapes of the reflector and the LED base.

A surface of the reflector may be straight or parabolic.

The LED base may be formed in a circular, elliptical or polygonal shape.

The light may be emitted from the light emitting part in a circular, elliptical or polygonal shape, depending on shapes of the reflector and the LED base.

The LED base may be formed of a reflective layer such that the emitted light is reflected toward the LED substrate.

According to another aspect of the present invention, there is provided a projection system including: red, green and blue LED surface light source each including a plurality of LEDs having LED chip; red, green and blue LED LCDs for displaying color images corresponding to red, green and blue lights emitted from the red, green and blue LED surface light source in response to electrical signals; a prism for synthesizing the respective color images provided from the red, green and blue LCDs; and a projection optical system for enlarging and projecting the synthesized images.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
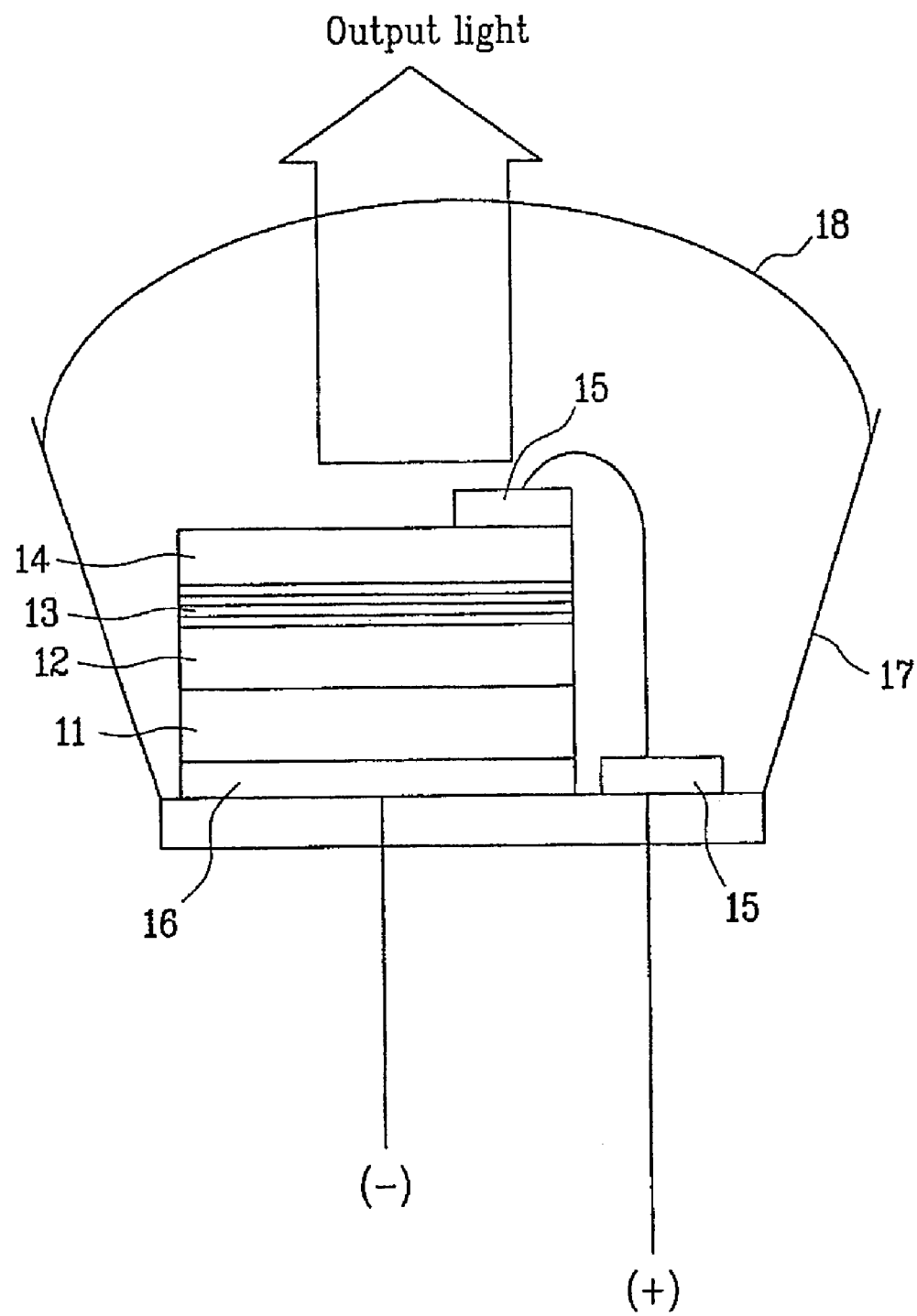
FIG. 1 is a view of an LED according to the related art.
Figure 2:
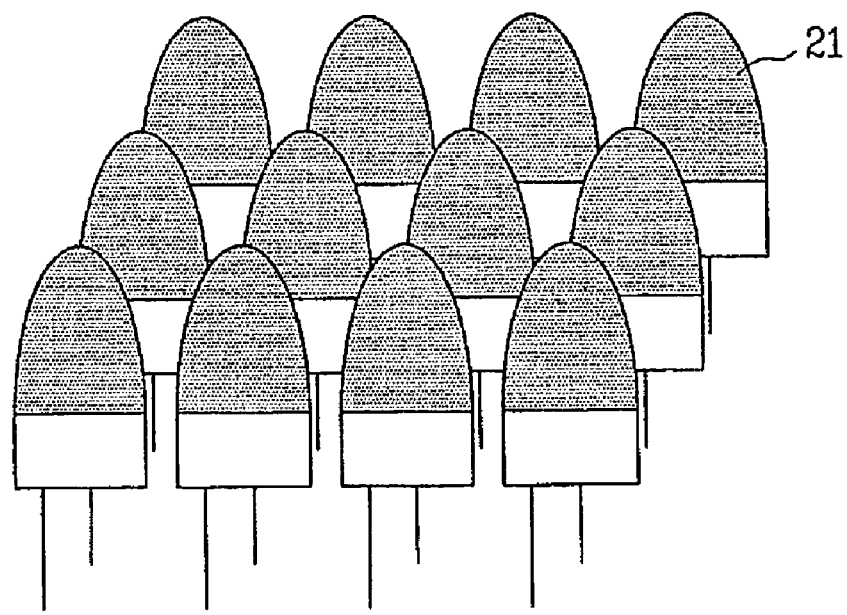
FIGS. 2A and 2B are views of the conventional LED used as a surface light source.
Figure 2:
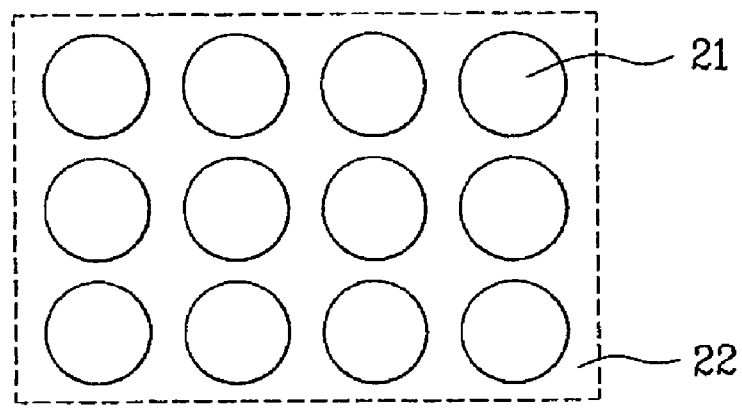
Figure 3:
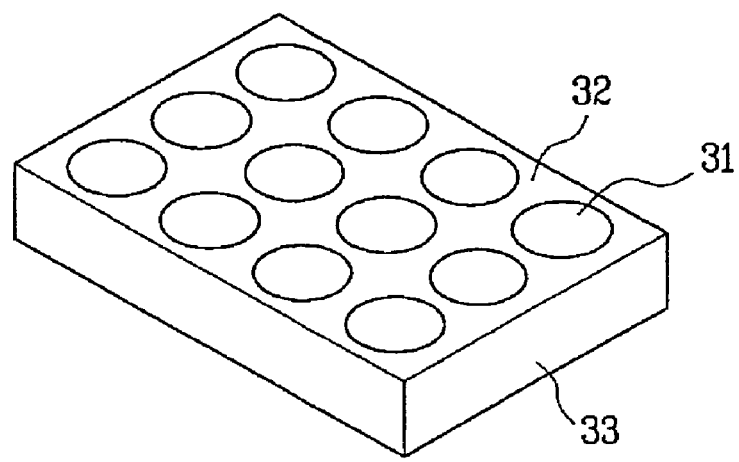
FIG. 3 is a plan view of an LED surface light source according to the present invention.
Figure 4:
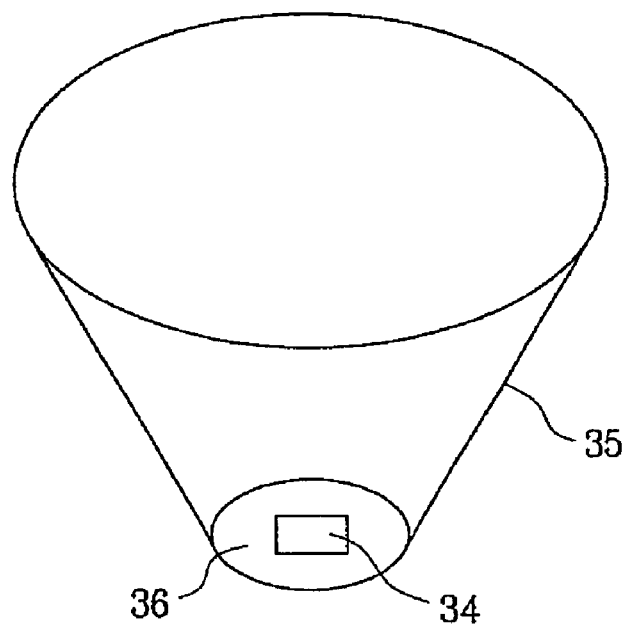
FIG. 4 is a view illustrating each LED of the LED surface light source shown in FIG. 3.

FIG. 3 is a plan view of an LED surface light source according to the present invention, and FIG. 4 is a view illustrating each LED of the LED surface light source shown in FIG. 3.

Referring to FIG. 3, an LED surface light source according to the present invention includes an upper plate 32 through which light is emitted and a lower plate 33 on which LEDs are arranged and supported.

Since LEDs having the same structure are regularly arranged on the LED surface light source in horizontal and vertical directions, the gaps between light emitting parts 31 become constant.

Referring to FIG. 4, each of the LEDs for the LED surface light source includes an LED chip 34, an LED base 36 on which the LED chip is formed, and a reflector 35 for reflecting an LED light generated from the LED chip and emitting it at a specific angle.

A structure of the LED chip 34 will be described later.

If each of the LEDs emits light due to an external electrical signal, a uniform light is surface-emitted, thereby forming the LED surface light source.

The upper plate 32 and the lower plate 33 are bonded together centering on both ends of the LED chip 34.

Figure 5:
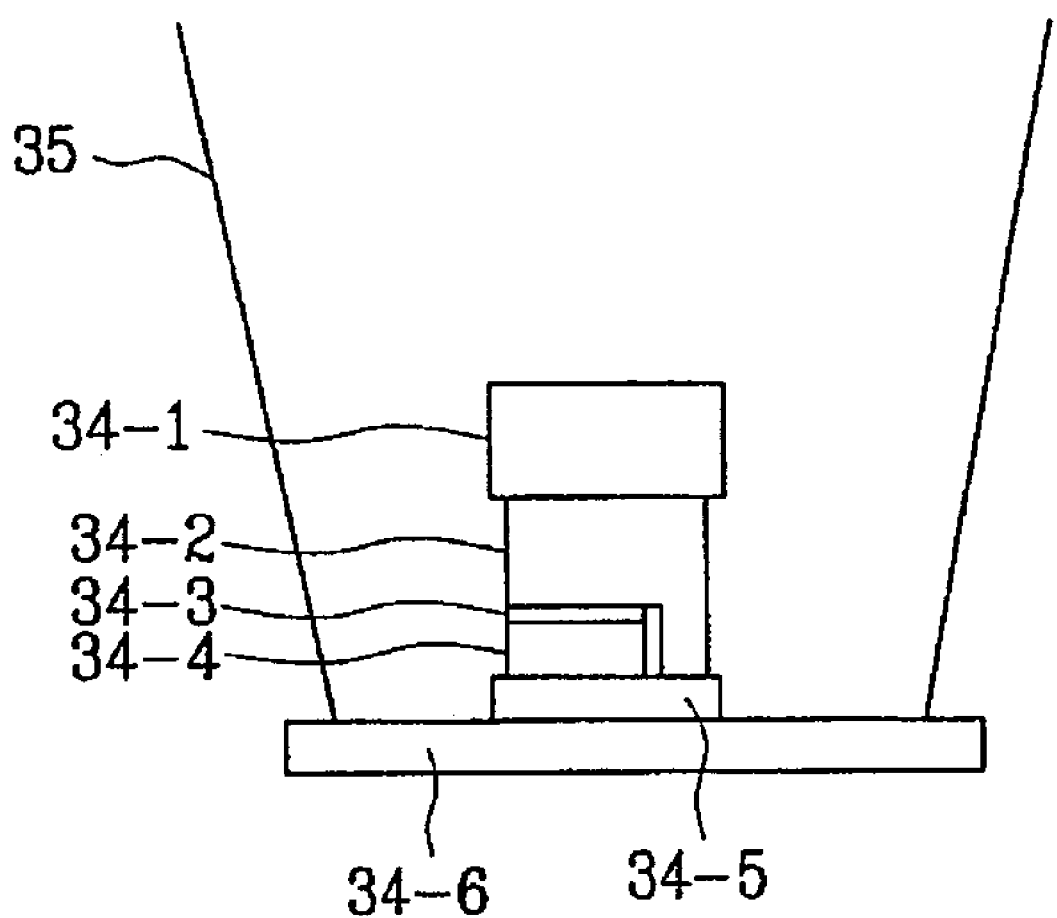
FIG. 5 is a view of an LED chip shown in FIG. 4.

FIG. 5 is a view of the LED chip shown in FIG. 4.

Referring to FIG. 5, the LED chip 34 includes an LED substrate 34-1, an LED p-type layer 34-2, a light-emitting layer 34-3 and an LED n-type layer 34-4, which are stacked in sequence.

In stacking the LED p-type layer 34-2, the remaining portions except for a portion to contact with a transparent electrode 34-5 later are removed.

The light emitting layer 34-3 and the LED n-type layer 34-4 are sequentially stacked on the removed portions.

At this point, the LED n-type layer 34-4 is stacked on the remaining LED p-type layer 34-2 using a mask, so that the LED n-type layer 34-4 cannot contact with the LED p-type layer 34-2.

A height of the portion where the LED p-type layer 34-2 contacts with the transparent electrode 34-5 is equal to that of the portion where the LED n-type layer 34-4 contacts with the transparent electrode 34-5.

The LED chip is turned over in a direction reverse to the stacked order and attached to the transparent electrode 34-5.

At this point, the LED p-type layer 34-2 and the LED n-type layer 34-4 respectively contact with an anode pattern and a cathode pattern and receive electrical signals.

The LED substrate 34-1 is formed of a transparent material so that the light from the light emitted from the light emitting layer 34-3 can be transmitted.

Next, a reflective layer 34-6 coated with a metal is attached to the transparent electrode 34-5.

If an electrical signal is applied to the reflective layer 34-6, the light is emitted from the light emitting layer 34-3 due to a voltage difference between the LED p-type layer 34-2 and the LED n-type layer 34-4.

The reflective layer 34-6 may be extended so that it can be commonly used by the adjacent LEDs. Simultaneously, the extended reflective layer 34-6 serves as the LED base.

The lights from the light emitting layer 34-3 are radiated in omni-direction. Among them, the light radiated toward the LED p-type layer 34-2 transmits the transparent LED substrate 34-1.

Meanwhile, the light radiated toward the LED n-type layer 34-4 transmits the transparent electrode 34-5 and then is reflected at the reflective layer 34-6 in a reverse direction.

The reflected light finally transmits the LED substrate 34-1 and is emitted outward.

Consequently, all the lights emitted from the LED chip 34 are emitted toward the LED substrate 34-1.

Then, the light from the LED chip 34 is reflected at the reflector 35 at a specific angle.

The output and an output angle of the LED light can be adjusted depending on a combination of the reflector 35 and the LED base 36.

Figure 6:
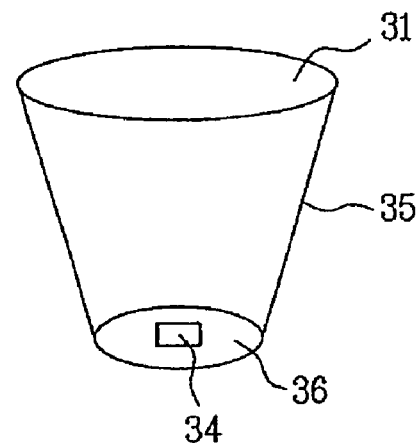
FIGS. 6A to 6C are views illustrating various shapes of a reflector used as the LED surface light source according to the present invention.
Figure 6:
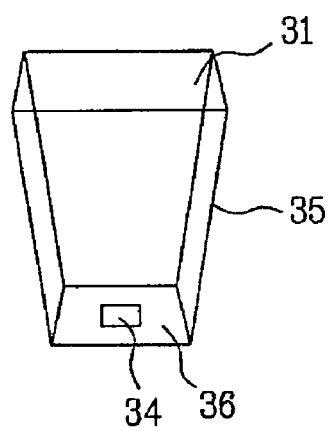
Figure 6:
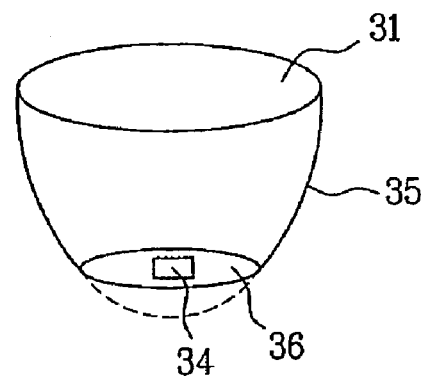

FIGS. 6A to 6C are views illustrating various shapes of the reflector used in the LED surface light source according to the present invention.

Referring to FIG. 6A, both the LED base 36 and the light emitting part 31 may be circular and the reflector 35 may be straight.

In such a structure, the light is emitted from the LED chip 34 in the circular shape. Also, if necessary, the light may be emitted in an elliptical shape.

Referring to FIG. 6B, both the LED base and the light emitting part 31 may be rectangular and the reflector 35 may be straight. Likewise, if necessary, the light may be emitted in a polygonal shape.

Referring to FIG. 6c, both the LED base 36 and the light emitting part 31 may be circular and the reflector 35 may be parabolic.

At this time, the light emitting layer of the LED chip 34 is disposed at a focus of the parabolic curve.

The angle and light distribution of the emitted light can be regulated by designing various shapes of the reflector 35.

Figure 7:
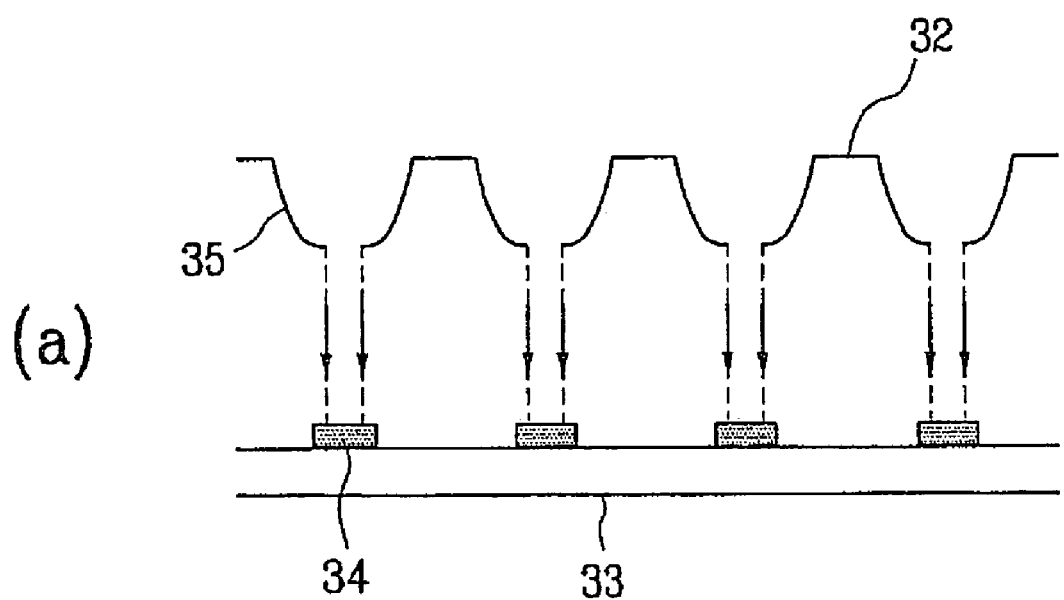
FIGS. 7A and 7B are views illustrating a process of attaching an upper plate and a lower plate in the LED surface light source according to the present invention.
Figure 7:
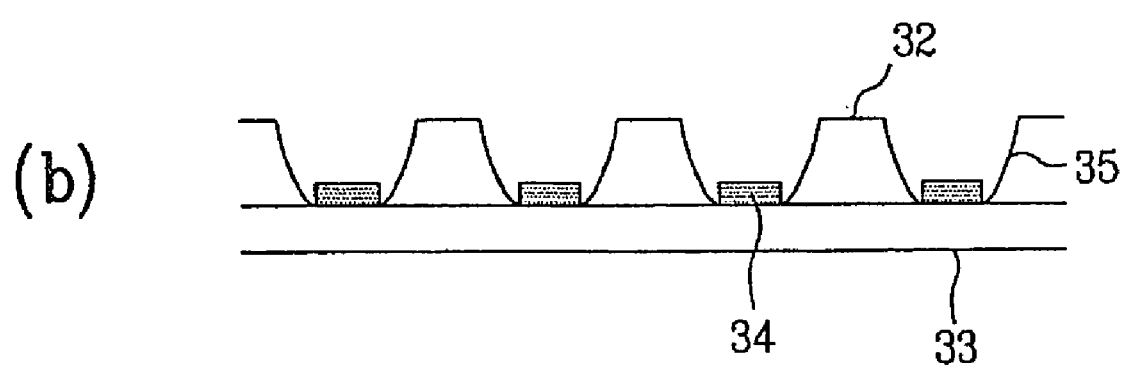

FIGS. 7A and 7B are views illustrating a process of attaching the upper and lower plates of the LED surface light source according to the present invention.

The LED chip 34 is very difficult to accurately dispose in a space between right and left sides of the reflector 35.

Accordingly, as shown in FIG. 7A, the upper plate 32 and the lower plate 33 are separately made and then attached to each other in order to effectively configure the LED surface light source.

That is, the upper plate 32 and the lower plate 33 are separately made and then the LED chip 34 is formed on the lower plate 33 so that it can be disposed at a center of the reflector 35. Then, the upper plate 32 and the lower plate 33 are attached to each other. In this manner, the LED surface light source is provided as shown in FIG. 7B.

Here, the upper plate 32 includes the light emitting part 31 and the reflector 35, and the lower plate 33 includes the LED chip 34, the transparent electrode 34-5 and the reflective layer 34-6.

If the surface light source is provided by arranging the LED chip 34 in the above manner, a larger number of the LED chips 34 can be integrated in unit area, compared with the conventional LED module. Therefore, the high power output can be obtained.

A case when the LED surface light source is applied to a projection system will now be described.

Figure 8:
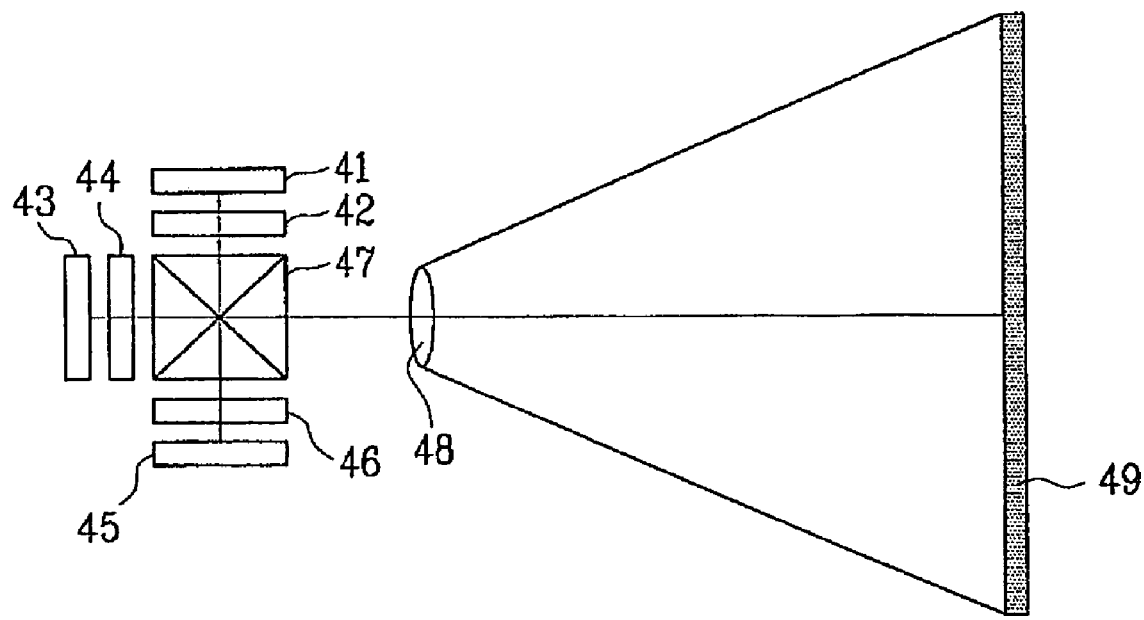
FIG. 8 is a view of an LCD projection system using the LED surface light source according to the present invention.

FIG. 8 is a view of an LCD projection system to which the LED surface light source of the present invention is applied.

Referring to FIG. 8, an LCD projection system includes red, green and blue LED surface light sources 41, 43 and 45, red, green and blue LCDs 42, 44 and 46, a prism 47, a projection optical system 48, and a screen 49.

The red, green and blue LED surface light sources 41, 43 and 45 radiate the red, green and blue LCDs 42, 44 and 46, respectively.

The red, green and blue LCDs 42, 44 and 46 display corresponding color images in response to electrical signals.

The respective color images are synthesized by the prism 7. Then, the synthesized color images are enlarged and projected on the screen 49 by the projection optical system 48. In this manner, the user can view the projected images.

Unlike the conventional projection system using the lamp, the LED surface light source according to the present invention radiates the light just behind the display elements. Therefore, the LCD projection system of the present invention does not require the color filters for color separation and the corresponding mirrors.

Accordingly, simpler and small-sized optical systems can be provided.

The LED surface light source according to the present invention has the following effects.

First, the high-power and high-integrated LED surface light source can be implemented. The manufacture of the reflector is easy and the desired light distribution and light-emitting angle can be implemented by designing the various shapes of the reflector.

Second, when the LED surface light source is used as the light source of the projection system, the separate color filters or mirrors are not required and thus the projection system can be smaller in size.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An LED surface light source comprising:
    an upper plate including a light emitting part for emitting LED light;
    a plurality of LEDs regularly arranged in horizontal and vertical directions; and
    a lower plate on which the plurality of LEDs are arranged and supported,
    wherein each of the plurality of LEDs includes an LED chip comprising an LED p-type layer, a light emitting layer, an LED n-type layer, and a transparent electrode, wherein the LED p-type layer and the LED n-type layer are in contact with the transparent electrode.

2. The LED surface light source of claim 1, wherein each of the LEDs comprises:
    an LED base for supporting the LED chip; and
    a reflector for reflecting light emitted from the LED chip at a specific angle.

3. The LED surface light source of claim 2, wherein the LED chip includes the LED p-type layer, the light emitting layer, the LED n-type layer and the transparent electrode, which are stacked on an LED substrate.

4. The LED surface light source of claim 3, wherein the LED chip is turned over in a direction reverse to the stacked order and attached to the LED base.

5. The LED surface light source of claim 3, wherein the LED substrate is formed of a transparent material, such that light is transmitted by the LED substrate.

6. The LED surface light source of claim 2, wherein a surface of the reflector is straight or parabolic.

7. The LED surface light source of claim 2, wherein the LED base is formed in a circular, elliptical or polygonal shape.

8. The LED surface light source of claim 2, wherein the light is emitted from the light emitting part in a circular, elliptical or polygonal shape, depending on shapes of the reflector and the LED base.

9. The LED surface light source of claim 2, wherein the LED base is formed of a reflective layer such that the emitted light is reflected toward an LED substrate.

10. The LED surface light source of claim 1, wherein the LED n-type layer is separated from the LED p-type layer by a mask.

11. A projection system comprising:
    red, green and blue LED surface light source each including a plurality of LEDs, wherein each of the plurality of LEDs includes an LED chip comprising an LED p-type layer, a light emitting layer, an LED n-type layer, and a transparent electrode, wherein the LED p-type layer and the LED n-type layer are in contact with the transparent electrode;
    red, green and blue LCDs for displaying color images corresponding to red, green and blue lights emitted from the red, green and blue LED surface light source in response to electrical signals;
    a prism for synthesizing the respective color images provided from the red, green and blue LCDs; and
    a projection optical system for enlarging and projecting the synthesized images.

12. The projection system of claim 11, wherein the LED further comprises:
    an LED base for supporting the LED chip; and
    a reflector for reflecting the light emitted from the LED chip at a specific angle.

13. The projection system of claim 12, wherein a surface of the reflector is straight or parabolic.

14. The projection system of claim 12, wherein the LED base is formed in a circular, elliptical or polygonal shape.

15. The projection system of claim 12, wherein the light is emitted from the light emitting part in a circular, elliptical or polygonal shape, depending on shapes of the reflector and the LED base.

16. The projection system of claim 12, wherein the LED base is formed of a reflective layer such that the emitted light is reflected toward the LED substrate.

17. The projection system of claim 11, wherein the LED chip comprises the LED p-type layer, the light emitting layer, the LED n-type layer and the transparent electrode, which are stacked on an LED substrate.

18. The projection system of claim 17, wherein the LED chip is turned over in a direction reverse to the stacked order and attached to the LED base.

19. The projection system of claim 17, wherein the LED substrate is formed of a transparent material, such that light is transmitted by the LED substrate.

20. The projection system of claim 11, wherein the LED n-type layer is separated from the LED p-type layer by a mask.

* * * * *